United States Patent
Van Der Zwan et al.

(10) Patent No.: US 7,489,791 B2
(45) Date of Patent: Feb. 10, 2009

(54) A/D CONVERTER WITH INTEGRATED BIASING FOR A MICROPHONE

(75) Inventors: Eric Jurgen Van Der Zwan, Eindhoven (NL); Henricus J. Kunnen, legal representative, Valkenswaard (NL); Eise Carel Dijkmans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1327 days.

(21) Appl. No.: 09/899,449

(22) Filed: Jul. 5, 2001

(65) Prior Publication Data

US 2002/0071578 A1   Jun. 13, 2002

(30) Foreign Application Priority Data

Jul. 5, 2000  (EP) .................. 00202381

(51) Int. Cl.
  *H04R 3/00* (2006.01)
  *H03M 1/06* (2006.01)
(52) U.S. Cl. .............. 381/113; 381/95; 341/143; 341/155; 330/296
(58) Field of Classification Search ......... 381/111–115, 381/172, 95, 91, 122; 341/143, 155; 370/200; 330/296, 260, 261
See application file for complete search history.

(56) References Cited

U.S. PATENT DOCUMENTS

| | | | | |
|---|---|---|---|---|
| 5,162,799 A | * | 11/1992 | Tanimoto | 341/143 |
| 5,347,279 A | * | 9/1994 | Ishihara et al. | 341/166 |
| 5,471,209 A | * | 11/1995 | Sutterlin et al. | 341/143 |
| 5,577,129 A | * | 11/1996 | Ehara | 381/113 |
| 5,614,904 A | * | 3/1997 | Dent | 341/143 |
| 5,832,076 A | * | 11/1998 | Holthaus et al. | 379/387.02 |
| 6,285,769 B1 | * | 9/2001 | Edelson et al. | 381/95 |
| 6,427,015 B1 | * | 7/2002 | Backram et al. | 381/120 |
| 6,456,219 B1 | * | 9/2002 | Schreiber et al. | 341/155 |
| 6,539,096 B1 | * | 3/2003 | Sigwanz et al. | 381/313 |
| 6,853,733 B1 | * | 2/2005 | Groothedde et al. | 381/111 |

FOREIGN PATENT DOCUMENTS

WO    9617493 A1    6/1996

\* cited by examiner

*Primary Examiner*—Xu Mei
(74) *Attorney, Agent, or Firm*—Michael E. Belk

(57) ABSTRACT

A combination of a microphone and a sigma-delta A/D converter include at least one feedback loop, such as a DC feedback loop. The DC feedback loop provides the bias current for a junction FET of the microphone. In this way, the signal current from the FET can be injected directly into the input integrator of the sigma-delta A/D converter without the need of signal resistors in series with the FET.

17 Claims, 4 Drawing Sheets

A/D CONVERTER WITH INTEGRATED BIASING FOR A MICROPHONE

The invention relates to a combination of a microphone and an A/D (analog-to-digital) converter circuit. Such a combination is used in, inter alia, hearing aids and mobile telephone sets.

In particular, the invention relates to a combination of a microphone requiring a bias signal generated externally, like an electret microphone and an A/D converter circuit. Electret microphones are ideally suited for portable devices, particularly owing to their fidelity and their small size and weight. For their operation electret microphones require the supply of an externally generated bias signal. Usually, electret microphones are packed with a JFET in a single housing.

To make use of the generally attractive properties of an electret microphone this requires the external generation of a bias current and the supply of this current to an electret microphone.

International Patent Application WO-A-96/17493 discloses a combination of a microphone requiring an externally generated bias signal and an A/D converter circuit, having its input connected to the output of the microphone, to convert the AC signal generated by the microphone into a digital signal at its output.

Although said document does not disclose the circuits needed to supply the bias current to the microphone, it is known to use a separate circuit for this purpose. FIG. 1 shows such a prior-art circuit. This circuit uses four external components: two resistors and two capacitors. These are circuit elements which cannot easily be incorporated into an integrated circuit. Furthermore, it is complicated to accurately control the values of these elements.

The aim of the invention is to provide a combination which precludes the disadvantages of the prior-art.

This aim is reached in that the A/D converter is operable to supply a bias signal to the microphone.

This feature eliminates the separate supply and the four extra components required for connecting the power supply to the microphone. Moreover, this eliminates the need for an extra pin for power supply of the microphone.

According to a first preferred embodiment the A/D converter is a $\Sigma\Delta$ converter comprising a loop filter, a sampler, a first feedback circuit for AC signals, including a first D/A converter, and a second feedback circuit for DC signals, including a second D/A converter, the bias signal for the microphone being derived from the second feedback circuit, and the first and the second feedback circuit are both being coupled to an input of the loop filter.

Obviously, this embodiment has the well-known advantages of a $\Sigma\Delta$ modulator, such as simplicity and low requirements on the accuracy of the components. Usually, the loop filter takes the form of an integrator.

However, apart from these advantages, it appears that a $\Sigma\Delta$ modulator is also advantageous for the supply of a bias to a microphone. This is because an A/D converter using a $\tau\Delta$ modulator includes a feedback circuit. The feed-back circuit is needed for the feedback of the AC output signal of the $\Sigma\Delta$ modulator, but also for feedback of the DC output signal of the modulator. In the prior-art the feedback DC signal is used for compensation of any DC offset on the input of the $\Sigma\Delta$ modulator. However, the presence of such a DC feedback loop offers the possibility of supplying power to an extra power consumer, like a microphone. Of course, the feedback loop should be dimensioned to supply the required direct current to the microphone.

Another advantage of this configuration is that no extra connections between the $\Sigma\Delta$ modulator and the microphone are needed; for the power supply the same two connections can be used as for the AC signal.

Furthermore, it is noted that the microphone delivers a signal as a current. The resistors of the external circuit convert this signal into a voltage. The $\Sigma\Delta$ modulator uses an integrator circuit with a capacitor, which means that the signal has to be reconverted into a current in order to be integrated by the capacitor. This is an inefficient way to treat a signal, requiring many components, and leading to the addition of noise generated in these components. The present embodiment precludes these disadvantages.

In a further preferred embodiment, the second feedback circuit includes a low-pass filter having a cut-off frequency lower than the lowest signal frequency of the A/D converter. This feature allows a proper separation between the AC feedback loop and the DC feedback loop, so that both loops can be optimized for their respective purposes.

This optimization is used in the situation wherein, according to another embodiment, the gain of the second feedback loop, which comprises the loop filter, the sampler and the second feedback circuit, is several orders of magnitude higher than unity. In this configuration the purpose of the higher loop gain of the DC loop is to obtain an adequate supply current to the microphone, so as to allow it to operate correctly, while the task of compensating for offset at the input of the $\Sigma\Delta$ modulator is maintained.

According to another advantageous embodiment the low pass filter is a digital filter and is included in the second feedback circuit before the second D/A converter. A digital filter is better suited for integration in an integrated circuit because it precludes the problems arising with capacitors, resistors and inductances needed in an analog filter, when these components have to be integrated in an integrated circuit.

In another preferred embodiment the first and the second feedback circuit are combined to a united feedback circuit including a single D/A (digital-to-analog) converter, having its input connected to a low pass filter, and a bypass circuit which bypasses the low-pass filter. This circuit eliminates the need for a second D/A converter.

In a further preferred embodiment the integrator comprises a bridge circuit, whose branches include current sources, which bridge circuit has a first pair of opposite junctions connected to a power supply, and has a second pair of opposite junctions connected to one another by a capacitor and the microphone, the junctions of said second pair each being connected to the inputs of the sampler circuit, and a pair of opposite current sources being controlled by the output signal of the feedback circuit. This configuration is very suitable for integration into a single chip because most elements can be realized as semiconductor devices.

The present invention now will be elucidated with reference to the accompanying drawings, in which.

Applications with a speech input, such as mobile telephones and hearing aids, often use electret capacitor microphones. It is common practice to include a JFET in the housing of such an electret microphone. The JFET has its gate connected to one of the terminals of the microphone and has its drain connected to the other terminal of the microphone. Further, a bias resistor incorporated in the same housing is connected in parallel with the microphone. The JFET is a depletion device, which means that it delivers a direct current if its gate-source voltage $V_{GS}$=0V. To obtain an output signal representing the variations of the air pressure in its vicinity, the combination of electret microphone and JFET requires a bias current.

Figure 1:
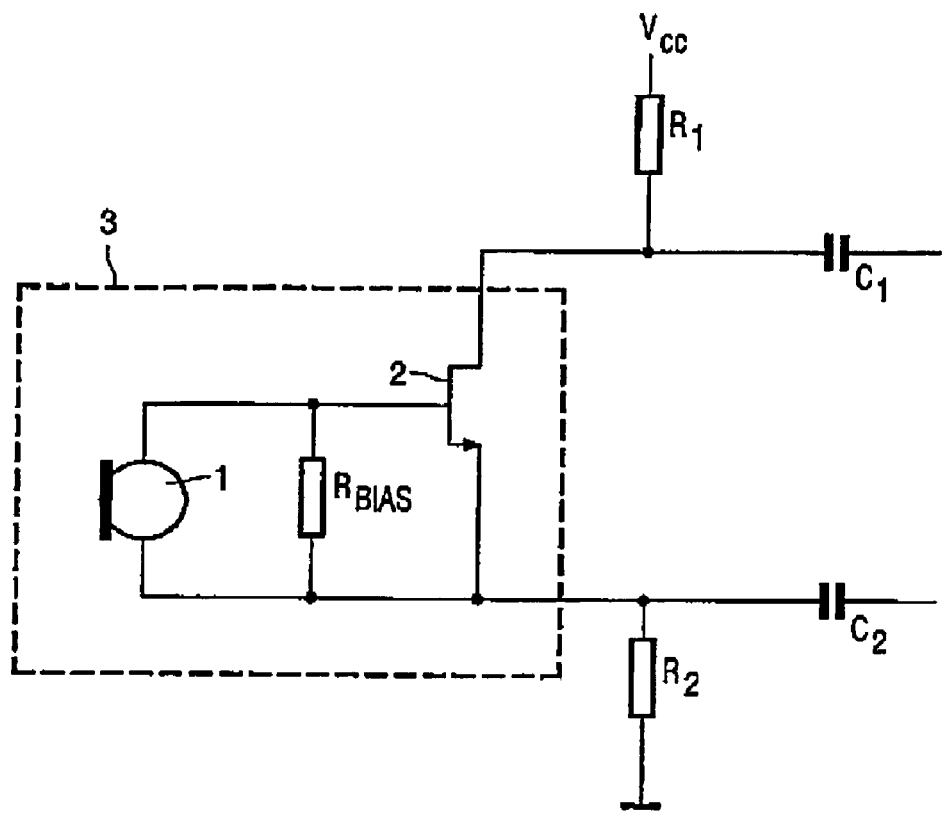
FIG. 1 is a diagram of a prior-art circuit for biasing an electret microphone.

FIG. 1 shows a diagram of a common prior-art circuit for supplying such a bias current to the combination of a microphone 1, a bias resistor $R_{BIAS}$ and a JFET (junction field effect transistor) 2, located within a housing 3. This circuit comprises two external resistors $R_1$ and $R_2$ for supplying the bias current from the power supply $V_{cc}$, and two capacitors $C_1$ and $C_2$, for coupling the signal to the inputs of a subsequent circuit, such as an amplifier, not shown.

Usually, the DC bias current is about 10 to 50 times as large as the actual AC signal current. The bias resistor $R_{BAS}$ biases the gate of the JFET so as to achieve that its gate-source voltage $V_{GS}$=0 V. In a typical application the combination of JFET and microphone delivers a current of 300 μA, which is converted into a voltage by the resistors $R_1$ and $R_2$. In a substantial number of cases the subsequent circuit comprises an integrator with a capacitor. In that case a voltage signal has to be converted back into a current signal in order to be integrated by the capacitor of the integrator. Consequently, two opposite conversions are needed in this prior-art circuit.

According to the invention, a circuit is proposed, in which these conversions are eliminated and in which the microphone, together with the JFET, receives its bias from the subsequent circuit.

In order to achieve this, said subsequent circuit should include a feedback circuit. This feedback circuit is used to supply the bias current. Such a feedback circuit is present in ΣΔ modulators, which are very well suited for processing the signal output of the microphone, in particular for A/D-conversion (analog-to-digital conversion) thereof. It is, however, conceivable that other types of circuits may be used with the present invention.

Figure 2:
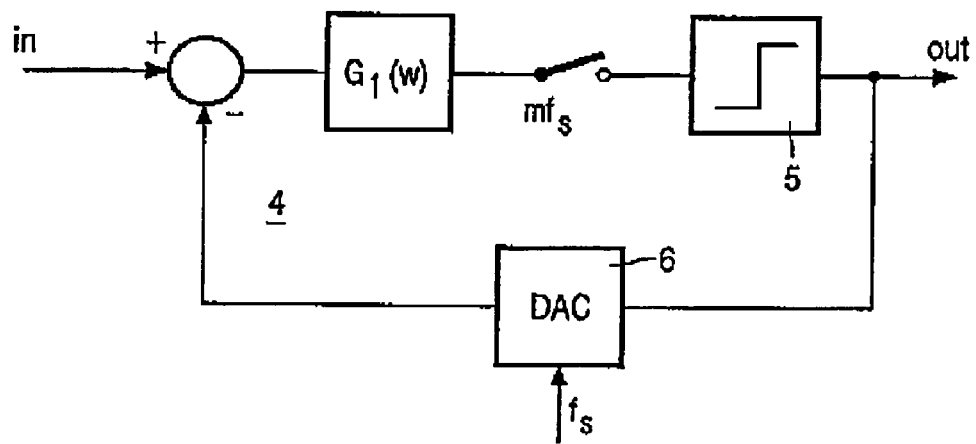
FIG. 2 is a diagram of a prior-art $\tau\Delta$ modulator.

FIG. 2 shows a diagram of a ΣΔ modulator 4. The ΣΔ modulator 4 comprises a filter G1, a sampling device, which samples at a rate of m.fs, wherein fs is the Nyquist sampling rate and m is the oversampling factor, and a quantizer circuit 5. Generally, the filter may be digital or analog, but in the present application the filter is analog. The output signal of the quantizer circuit 5 is fed back through a D/A (digital-to-analog) converter 6 and added to the output of the combination of the microphone 1 and the JFET 2, the resulting added signals being fed to the input of the filter G1. Such a circuit is known per se from the prior-art.

Figure 3:
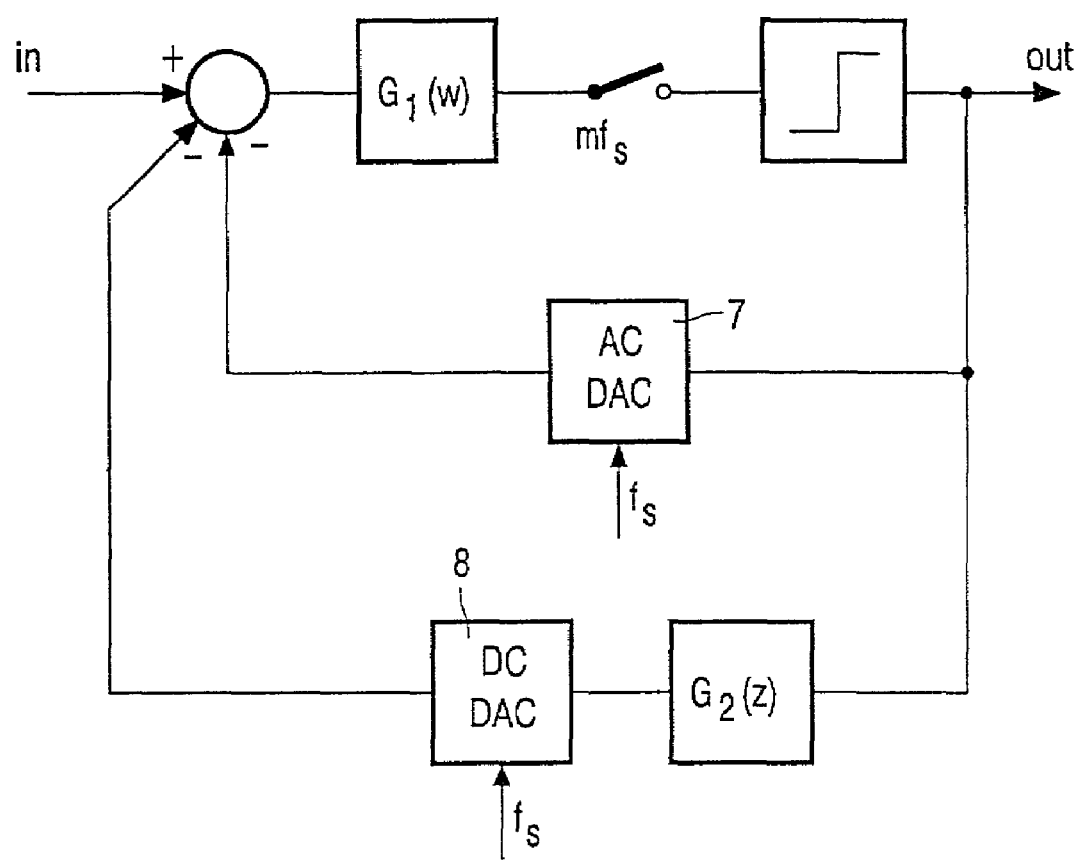
FIG. 3 is a diagram of a $\tau\Delta$ modulator used in a first embodiment of the present invention.

FIG. 3 shows a diagram of a circuit used in an embodiment of the invention. This circuit comprises a feedback loop, which is separated in a feed-back loop for AC signals, including a D/A converter 7, and a feedback loop for DC signals including a D/A converter 8. In this respect it is to be noted that in the present context slowly varying signals are also regarded as DC signals.

To separate the DC signals from the AC signal, a filter G2 is used. This filter G2 is included in the DC feedback loop. As the filter G2 is located before the D/A converter 8, a digital filter has to be used. The cut-off frequency of the DC filter must be lower than the lowest signal frequency. In telephony applications the signal bandwidth is 300-3400 Hz, so that the cut-off frequency should be lower than 300 Hz.

In this circuit the output of the DC feedback loop, i.e. the output of the D/A converter 8, is applied to the combination of a microphone 1 and JFET 2 as the bias. Of course, the bias supplied by the DC feedback loop causes a DC offset in the output signal of the τΔ modulator. To minimize this offset the loop gain of the DC feed-back loop should be high.

The circuit further includes the feedback loop for the AC signals. This feedback loop includes the D/A converter 7. This loop is used for the normal operation of the ΣΔ modulator.

Figure 4:
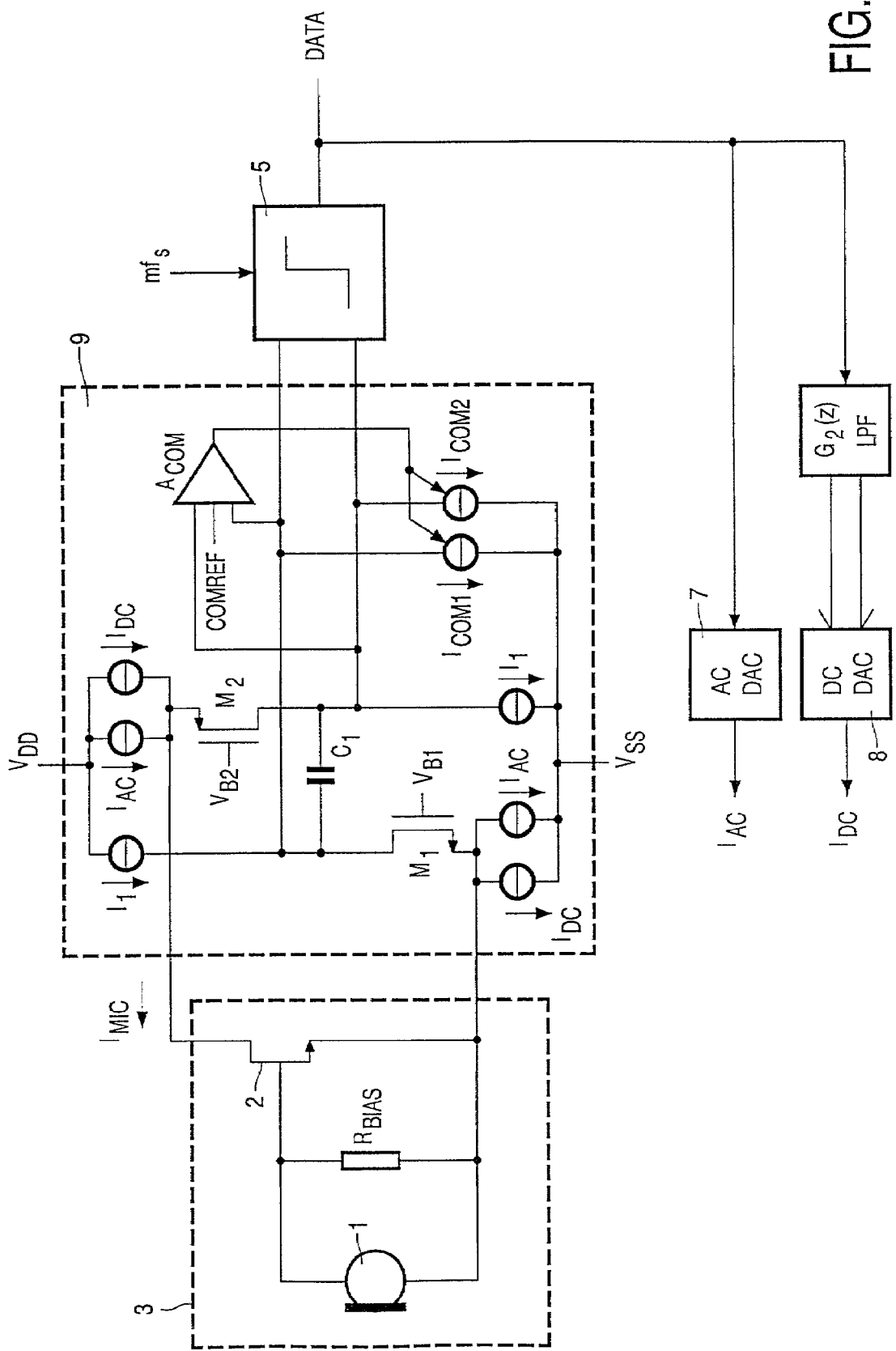
FIG. 4 is a diagram of the $\tau\Delta$ modulator shown in FIG. 3, the integrating circuit being shown in greater detail.

An example of a first order ΣΔ modulator is shown in FIG. 4. It comprises an integrator 9, a sampler/quantizer 5, and separate feedback paths for DC and AC signals. A higher order can be obtained by increasing the order of the continuous-time loop filter, for example using Gm-C integrators. The AC loop with the AC-D/A converter 7 is a ΣΔ modulator where the input current and feedback current are subtracted at the sources of FETs $M_1$ and $M_2$. The feedback current $I_{AC}$ can be positive or negative, depending on the output bitstream code of the modulator.

The DC loop provides feedback only for very low-frequency or DC signals. The bandwidth of the DC loop is determined by filter $G_2(z)$.

The common-mode output voltage of the differential integrator is controlled using a common-mode amplifier $A_{COM}$ and controlled current sources $I_{COM1}$ and $I_{COM2}$. It is assumed here, for simplicity, that this common-mode voltage is correct for $I_{COM1}=I_{COM2}=0$. In that case, if the microphone current $I_{MIC}$ contains a DC component $I_0$ and a signal component $i_{signal}$, $$I_{MIC}=I_0+i_{signal}=I_{DC}-I_1+av(I_{AC}) \qquad (1)$$

where $av(I_{AC})$ denotes the average value of switching current source $I_{AC}$.

The separation in the feedback loop between AC and DC signals forces $$I_0=I_{DC}-I_1 \qquad (2)$$

$$I_{signal}=av(I_{AC}) \qquad (3)$$

The output of the τΔ modulator is a voltage, and the D/A converters 7 and 8 provide an output current. It is assumed that the voltage-to-current conversion of the AC-D/A converter 7 has a transconductance $g_{m,AC}$, and the DC-D/A converter 8 has a transconductance $g_{m,DC}$. The quantizer is, as is usual in ΣΔ modulators, modeled by a gain c and an additive noise source N. Furthermore, the loop filter of the ΣΔ modulator, which is of the first order in the above example, has a transfer function $G_1(s)$. For simplicity, for low frequencies the effect of the hold function in the D/A converters can be neglected, and the transfer function of $G_2(z)$ together with the hold function is assumed to be the continuous-time transfer function $G_2(s)$. In the frequency domain, the output signal Y of the ΣΔ modulator is:

$$Y=\frac{cG_1}{1+cG_1(g_{m,DC}\ G_2+g_{m,AC})}I_{MIC}+\frac{1}{1+cG_1(g_{m,DC}\ G_2+g_{m,AC})}N \qquad (4)$$

For frequencies within and below the signal band, i.e. for frequencies much lower than the oversampling frequency, $mf_s$, $cG_1(g_{m,DC}G_2+g_{m,AC}) \gg 1$. Moreover, for signals within the bandwidth of the DC filter $g_{m,DC}G_2 \gg g_{m,AC}$, so that $$Y_{DC} = \frac{1}{g_{m,DC} G_2} I_{MIC} + \frac{1}{cg_{m,DC} G_1 G_2} N \quad (5)$$

For frequencies within the signal band of the ΣΔ modulator, i.e. above the cut-off frequency of the DC path, but still much lower than $mf_s$, $g_{m,DC}G_2 >> g_{m,AC}$, so that $$Y_{AC} = \frac{1}{g_{m,AC}} I_{MIC} + \frac{1}{cg_{m,AC} G_1} N \quad (6)$$

When equations (5) and (6) are combined and it is assumed that the microphone current $I_{MIC}$ consists of DC component $I_0$ and AC component $i_{signal}$, the output signal Y is:

$$Y = \frac{1}{g_{m,DC} G_2} I_0 + \frac{1}{g_{m,AC}} i_{signal} + \frac{1}{cg_{m,AC} G_1} N \quad (7)$$

The noise term in equation (5) is much smaller than the noise term in equation (6), and is therefore neglected.

Equation (7) shows the offset component in the output signal, which should be suppressed by an adequate gain in the DC path. The cut-off frequency of the DC path is the frequency for which $g_{m,DC}G_2 = g_{m,AC}$.

This technique requires only two IC pins and no external components. Compared to FIG. 1, an IC pin and 4 components are saved. Furthermore, this configuration can operate at a very low supply voltage, because the path from the positive supply voltage $V_{DD}$ to the negative supply voltage $V_{ss}$ contains two current sources and a transistor. This requires three times a drain-to-source voltage, which may be as low as 0.4 V. Of course, some signal swing is required at the output nodes (the drains of transistors $M_1$ and $M_2$ in FIG. 4). Moreover, the gates of transistors $M_1$ and $M_2$ must be properly biased. This means that the lower limit of the supply voltage is about 0.7 V.

Figure 5:
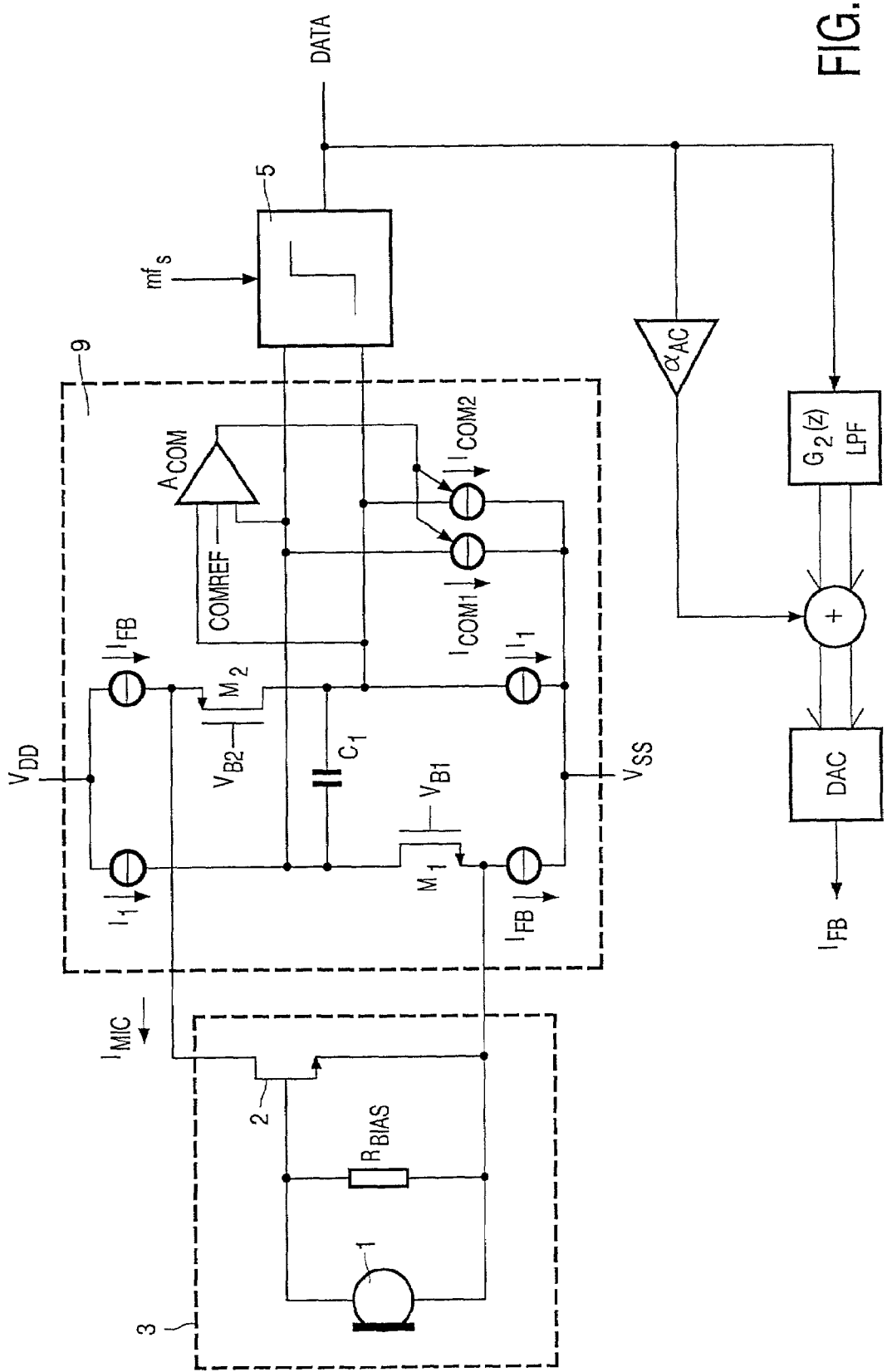
FIG. 5 is a diagram of a modulator which is similar to that in FIG. 4 but in which the D/A converter in the feed-back loop has been combined for AC and DC signals.

FIG. 5 shows another embodiment using only one D/A converter in the feedback loop. This is achieved by adding the AC and the DC feedback signals in the digital domain, just before the DAC. Gain $\alpha_{AC}$ is needed for the appropriate scaling of the AC signal with respect to the DC signal, and is equivalent to $$\frac{g_{m,AC}}{g_{m,DC}}$$

in the above example.

It will be clear that many variants to the embodiments of the invention described above are possible without deviating from the scope of the invention, as defined in the appended claims.

The invention claimed is:

1. A combination of a microphone requiring a bias signal and a sigma-delta converter operable to supply a bias signal to the microphone and having an input connected to an output of the microphone, to convert a signal generated by the microphone into a digital signal at an output of the sigma-delta converter, wherein the sigma-delta converter comprises: a loop filter, a sampler, a first feed back circuit for AC signals, including a first digital-to-analog converter, and a second feedback circuit for DC signals, including a second digital-to-analog converter, the bias signal for the microphone being derived from the second feedback circuit, and the first feedback circuit and the second feedback circuit both being coupled to an input of the loop filter.

2. The combination as claimed in claim 1, wherein the second feed back circuit includes a low pass filter having a cut-off frequency lower than a lowest signal frequency of the analog-to-digital converter.

3. The combination as claimed in claim 2, wherein the low pass filter is a digital filter and is included in the second feedback circuit before the second digital-to-analog converter.

4. The combination as claimed in claim 3, wherein the first feedback circuit and the second feedback circuit are combined to a united feed-back circuit including a single digital-to-analog converter, having an input connected to a low-pass filter, and a bypass circuit which bypasses the low-pass filter.

5. The combination as claimed in claim 1, wherein a gain of a second feed back loop, which comprises the loop filter, the sampler and the second feedback circuit, is several orders of magnitude higher than unity.

6. The combination as claimed in claim 1, comprising a bridge circuit, whose branches include current sources, which bridge circuit has a first pair of opposite junctions connected to a power supply, and has a second pair of opposite junctions connected to one another by a capacitor and the microphone, the junctions of said second pair each being connected to inputs of the sampler, and a pair of opposite current sources being controlled by an output signal of one of the first feedback circuit and the second feedback circuit.

7. The combination as claimed in claim 6, further comprising an integrator including a common mode amplifier having an output for driving control inputs of controllable current sources connected between inputs of the sampler and a line of a power supply.

8. A system comprising:
a microphone requiring a bias signal; and
an analog-to-digital converter configured to convert a signal generated by the microphone into a digital signal and to supply the bias signal to the microphone;
the analog-to-digital converter comprising a loop filter, a sampler, a first feed back circuit, and a second feedback circuit, wherein the first feedback circuit and the second feedback circuit are coupled to an input of the loop filter.

9. The system of claim 8, wherein the bias signal for the microphone is derived from one of the first feed back circuit and the second feed-back circuit.

10. The system of claim 8, wherein the first feed back circuit is for AC signals and the second feedback circuit is for DC signals.

11. The system of claim 8, wherein the second feedback circuit is for DC signals and the bias signal for the microphone is derived from the second feed-back circuit.

12. The system of claim 8, wherein the second feed back circuit includes a low pass filter having a cut-off frequency lower than a lowest signal frequency of the analog-to-digital converter.

13. The system of claim 12, wherein the low pass filter is a digital filter and is included in the second feedback circuit before the second digital-to-analog converter.

14. The system of claim 8, wherein a gain of a feed back loop comprising the loop filter, the sampler and the second feedback circuit, is several orders of magnitude higher than unity.

15. The system of claim 8, wherein the first feedback circuit and the second feedback circuit are combined to a united feed-back circuit including a single digital-to-analog converter, having an input connected to a low-pass filter, and a bypass circuit which bypasses the low-pass filter.

16. The system of claim 8, further comprising a bridge circuit having branches that include current sources, wherein the bridge circuit has a first pair of opposite junctions connected to a power supply, and has a second pair of opposite junctions connected to one another by a capacitor and the microphone, the junctions of said second pair each being connected to inputs of the sampler, and a pair of opposite current sources being controlled by an output signal of one of the first feedback circuit and the second feedback circuit.

17. The system of claim 8, further comprising an integrator including a common mode amplifier having an output for driving control inputs of controllable current sources connected between inputs of the sampler and a power supply.

* * * * *